United States Patent [19]

Findley

[11] Patent Number: 4,739,519
[45] Date of Patent: Apr. 19, 1988

[54] COPLANAR MICROWAVE BALUN, MULTIPLEXER AND MIXER ASSEMBLIES

[75] Inventor: Eugene C. Findley, Sunnyvale, Calif.

[73] Assignee: Narda Western Operations, San Jose, Calif.

[21] Appl. No.: 793,569

[22] Filed: Oct. 31, 1985

[51] Int. Cl.$^4$ .................. H04B 1/26; H01P 5/10; H01P 5/18
[52] U.S. Cl. .................... 455/327; 333/26; 333/238; 333/128; 455/330
[58] Field of Search ............... 333/21 R, 26, 238, 246, 333/128; 455/327

[56] References Cited

U.S. PATENT DOCUMENTS

| | | | |
|---|---|---|---|
| 3,755,759 | 8/1973 | Cohn | 333/21 R |
| 3,784,933 | 1/1974 | Scherer et al. | 333/26 |
| 3,955,156 | 5/1976 | Fleming | 333/246 X |
| 3,995,239 | 11/1976 | Head et al. | 333/21 R |
| 4,123,730 | 10/1978 | Fikart | 333/26 |
| 4,435,848 | 3/1984 | Sedlmair | 333/26 X |

FOREIGN PATENT DOCUMENTS

153603  8/1985  Japan .................. 333/26

Primary Examiner—Paul Gensler
Attorney, Agent, or Firm—Spensley Horn Jubas & Lubitz

[57] ABSTRACT

A coplanar microwave balun is disclosed in which a signal propagating along a coplanar waveguide in an unbalanced mode is launched onto another coplanar transmission line in the balanced mode. One of the ground planes of the latter transmission line itself is separated into a pair of regions which constitute the ground planes of the coplanar waveguide. These pair of regions are electrically connected, e.g., by ribbon bonds that bridge across the transmission line strip of the coplanar waveguide. The end of that transmission line strip bridges across the coplanar transmission line and acts to launch the signal thereto. The inventive balun advantageously is employed in a three port device having isolated inputs from which separate signals may be multiplexed onto a common line, and may be used in other multiplexer, mixer and modulator assemblies.

6 Claims, 13 Drawing Sheets

DOUBLE BALANCED MIXER ASSEMBLY

— ELECTRIC FIELD LINES
- - - MAGNETIC FIELD LINES

SINGLE BALANCED MIXER SUBSTRATE

COPLANAR MICROWAVE BALUN, MULTIPLEXER AND MIXER ASSEMBLIES

BACKGROUND OF THE INVENTION

1. Field of the Invention

The present invention relates to broadband microwave integrated circuits, and in particular to coplanar microwave balun, multiplexer and mixer assemblies.

2. Description of the Prior Art

The desire to provide broadband microwave integrated circuits has forced a new look at methods of multiplexing two signals on a common coplanar line. There have been extensive studies on methods to launch single signals onto slot lines and coplanar waveguide lines, but few have been directed towards launching multiple signals onto a common line. These studies have focused on techniques that are complex in realization and limited in bandwidth.

Accordingly, one objective of the present invention is to provide coplanar microwave assemblies operative over wide bandwidths, for multiplexing two microwave signals onto a common line. The microwave signals will propagate down the common line in different modes. Another objective is to provide such assemblies in which the two input ports are electrically isolated from each other.

Various types of microwave devices can be advantageously constructed utilizing such wideband coplanar multiplexing techniques. These include balanced mixers, balanced modulators and balanced frequency multipliers. Such devices take advantage of the concurrent propagation on a single line in different modes of two microwave signals. Thus a further objective of the present invention is to provide microwave coplanar integrated circuit mixers and modulators, having the characteristics of broad bandwidth, low VSWR and simple structure.

SUMMARY OF THE INVENTION

These and other objectives are achieved by providing a basic coplanar microwave balun device. This can be used by itself to provide mode transformation of a microwave signal between balanced and unbalanced modes. Such balun can be used to multiplex two microwave signals onto to a common line, with the two signals propagating down the common line in different modes, one balanced and the other unbalanced. Such baluns also are useful in mixer and modulator assemblies.

In accordance with the present invention, a coplanar microwave balun is formed on one surface of a dielectric substrate by having first and second ground plane regions on opposite sides of the transmission line. This transmission line can either be a slot line, which is defined by the separation between the two ground plane regions, or may be a coplanar waveguide, in which instance a transmission line strip is provided within the separation between the first and second ground plane regions.

In either case, the first ground plane region itself is separated into a pair of regions which constitute the ground planes of another coplanar waveguide. The transmission line strip of that coplanar waveguide extends along the center of the separation of the pair of regions. The end of the transmission line strip crosses the other transmission line and is electrically attached to the second ground plane. It is at this crossing that a signal is launched from one transmission line into the other with a change of mode. The pair of ground plane regions themselves are electrically connected by appropriate ribbon bonds or the like.

This basic structure exhibits various advantageous features. First, it is of simple construction, being situated completely on one side of a dielectric structure. Fabrication is simplifed, as is electrical connection to the device. The device facilitates broadband mode transformation. Where the first coplanar transmission line itself is propagating a signal in an unbalanced mode, this signal will be undisturbed by a second signal launched onto a transmission line by the inventive device in a balanced mode. The two microwave signals propagate down the common line in the different modes. This allows the signals to be separately recovered from the common line. A microwave multiplexer thereby can be implemented.

In a three terminal embodiment, advantageously the first coplanar transmission line itself is a coplanar waveguide which has a narrow portion flaring into a wider portion. In a three port device utilizing such structure, the two input ports are electrically isolated from each other. A signal injected via one of these input ports will not be delivered to the other input port. On the other hand, if two separate signals are injected respectively via the two input ports, both will be delivered, in different modes, and in multiplexed fashion, to the common output terminal.

Variants of the basic balun structure advantageously are incorporated in multiplexer, mixer and modulator assemblies such as those described hereinbelow.

BRIEF DESCRIPTION OF THE DRAWINGS

A detailed description of the invention will be made with reference to the accompanying drawing wherein like numerals designate corresponding elements in the several figures.

DESCRIPTION OF THE PREFERRED EMBODIMENT

The following detailed description is of the best presently contemplated mode of carrying out the invention. This description is not to be taken in a limiting sense, but is made merely for the purpose of illustrating the general principles of the invention since the scope of the invention best is defined by the appended claims.

Figure 1:
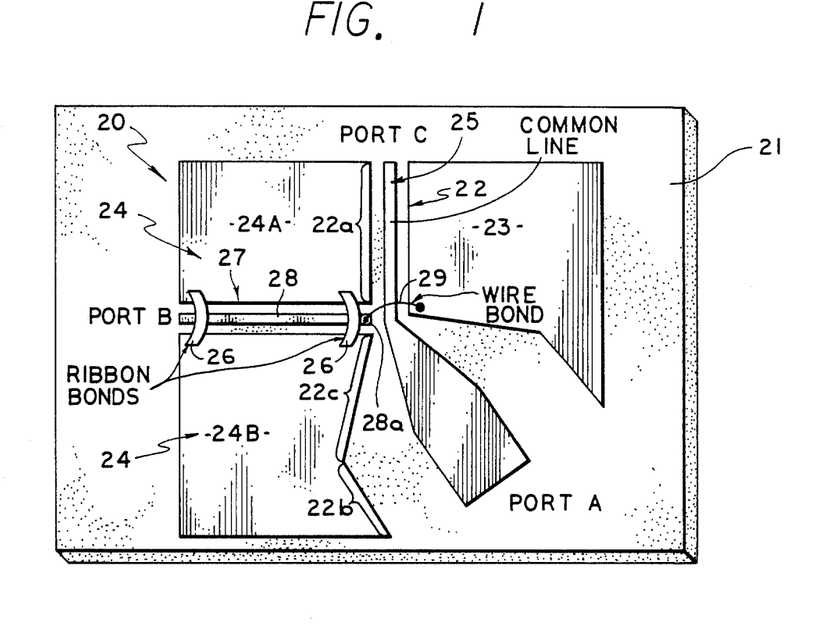
FIG. 1 is a plan view of a microwave coplanar balun assembly in accordance with the present invention.

Referring now to FIG. 1, there is shown a coplanar microwave balun device 20 in accordance with the present invention. This device is fabricated on one side of a dielectric substrate 21. The device includes a first coplanar transmission line which in this instance is a coplanar waveguide 22. This waveguide itself has first and second ground plane regions 23 and 24 which typically comprise metalized layers formed on the surface of the dielectric substrate 21. The coplanar waveguide 22 further includes a transmission line strip 25 situated in the space between the ground plane regions 23 and 24.

In the embodiment of FIG. 1, the coplanar waveguide 22 has a narrow portion 22a with relatively close spacing between the ground plane regions 23 and 24A. It is this portion 22a that forms a common line for the device 20. It terminates in a port C.

Figure 2A:
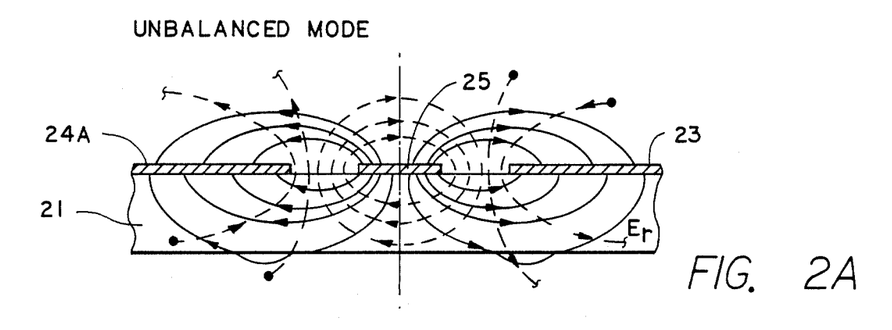
FIGS. 2A and 2B illustrate electrical field distributions of signals propagated in the device of FIG. 1 respectively in the unbalanced and balanced modes.

The other end of the coplanar waveguide 22, associated with port A of the device 20, is a portion 22b of wide spacing. There is an intermediate region 22c in which the coplanar waveguide 22 flares out from the narrow portion 22a to the wide portion 22b. Appropriate proportions are maintained throughout the length of the waveguide 22 so that a uniform impedance, say 50 ohms, is maintained. In this manner, a signal injected into the port A in the usual unbalanced mode (illustrated in FIG. 2A) will be propagated, unchanged in mode, to the port C.

The device 20 also has a second coplanar transmission line 27, which itself is a coplanar waveguide. The pair of ground plane regions 24A and 24B (which together form one ground plane region of the waveguide 22) constitute the separate ground planes of the coplanar waveguide 27. Situated along the center of the separation between these ground plane regions 24A, 24B is the transmission line strip 28 of the waveguide 27.

Port B communicates to one end of the waveguide 27. At the other end, the transmission line strip terminates perpendicular to the first coplanar waveguide 22. From this end 28a of the strip 28 a wire bond 29 bridges across the transmission line strip 25 of the waveguide 22 and is attached to the ground plane 23.

Figure 2B:
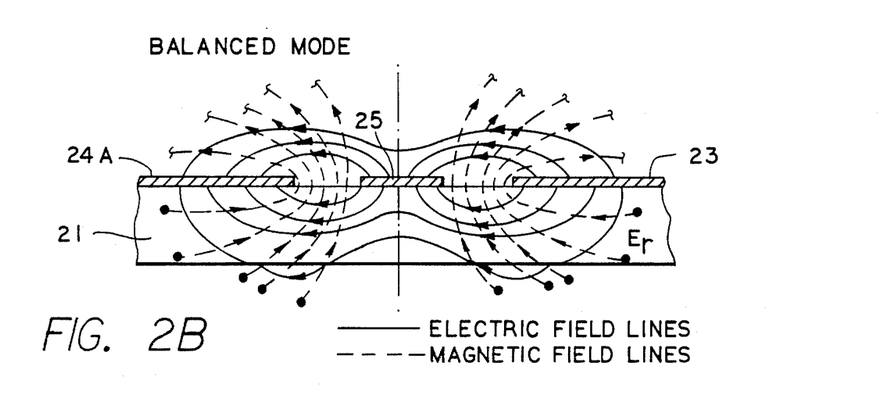

It is at the location at this wire bond bridge 29 that a signal propagating down the waveguide 27 is launched into the narrow region 22a of the waveguide 22, with a change of mode. Specifically, a signal injected at port B will travel along the coplanar waveguide 27 in the unbalanced mode of FIG. 2A. At the location of the wire bond bridge 29, this signal will be injected into the narrow coplanar waveguide region 22A in the balanced mode of FIG. 2B. In this balanced mode, the signal exists between the two ground planes 23 and 24A of the common line 22a. The signal propagates down this common line in a balanced mode as if it were in a slot line. That is, the portion 22a of the waveguide 22 is sufficiently narrow in width so that it tends to look like a slot line to the signal injected in the balanced mode from the wire bond bridge 29. However, the same signal does not propagate toward port A, because the width in the region 22b is sufficiently wide so that it tends to look like an open circuit.

As a result of such operation, a signal injected into the port B in the unbalanced mode will be delivered by the device 20 to the port C in a balanced mode, but will not be delivered to the port A. The transmission is bidirectional, so that a signal injected in port C in the balanced mode will in turn be injected into the waveguide 27 in an unbalanced mode and will be delivered to the port B. However, such signal will not be delivered to the port A, since the transmission line portion 22b is sufficiently wide so as to appear to be an open circuit to a balanced mode signal introduced at port C.

Moreover, if an unbalanced mode signal is introduced at port A, it will be delivered, unchanged in mode, to the port C. But this signal will not be injected onto the transmission line 27, and will not appear at port B. Similarly, an unbalanced mode signal injected at the port C will be communicated through to the port A but not to the port B. Thus the device constitutes a three terminal assembly in which two of the ports A and B are completely isolated from one another. This isolation is not only in terms of signal propagation, but also in terms of electrical potential. Since both conductors of port B are connected to the port A ground plane, there is no electrical potential at port A when port B is excited. The converse is true since both conductors of port B are grounded with respect to port A.

The device 20 of FIG. 1 also constitutes a multiplexer. It is clear that if two separate signals are respectively injected at ports A and B, both will be present on the common line 22a. The signal from the port A will be in the unbalanced mode and the signal from the port B will be in the balanced mode. Both are available at port C, and can there be demultiplexed (such as by using another like device 20, as illustrated by the dual multiplexer assembly 30 of FIG. 3).

Thus the device 20 of FIG. 1 illustrates several basic features of the present invention. First, it is a coplanar waveguide balun. That is, it operates to transform a signal from a balanced to an unbalanced mode or vice versa. This occurs between ports B and C in FIG. 1. This feature can be used in a two terminal device, where the port A portion of FIG. 1 is omitted or not utilized. Furthermore, there is no restriction that the transmission line 22 be a coplanar waveguide. It could also be a slot line. Such arrangement is described further in connection with FIG. 7.

In another aspect of the invention, the device 20 of FIG. 1 is a coplanar microwave multiplexer. In this regard, signals injected at ports A and B are multiplexed, in respectively different modes, on the common line 22a and are available at the port C. Yet another feature of the invention is that the embodiment of FIG. 1 constitutes a three port device, wherein two of the ports, A and B, are isolated from one another both electrically and with respect to signal transmission. In all cases, the device of FIG. 1 has very wideband characteristics. Furthermore, it is simple to construct being fabricated on the one side of a common dielectric substrate.

Figure 3:
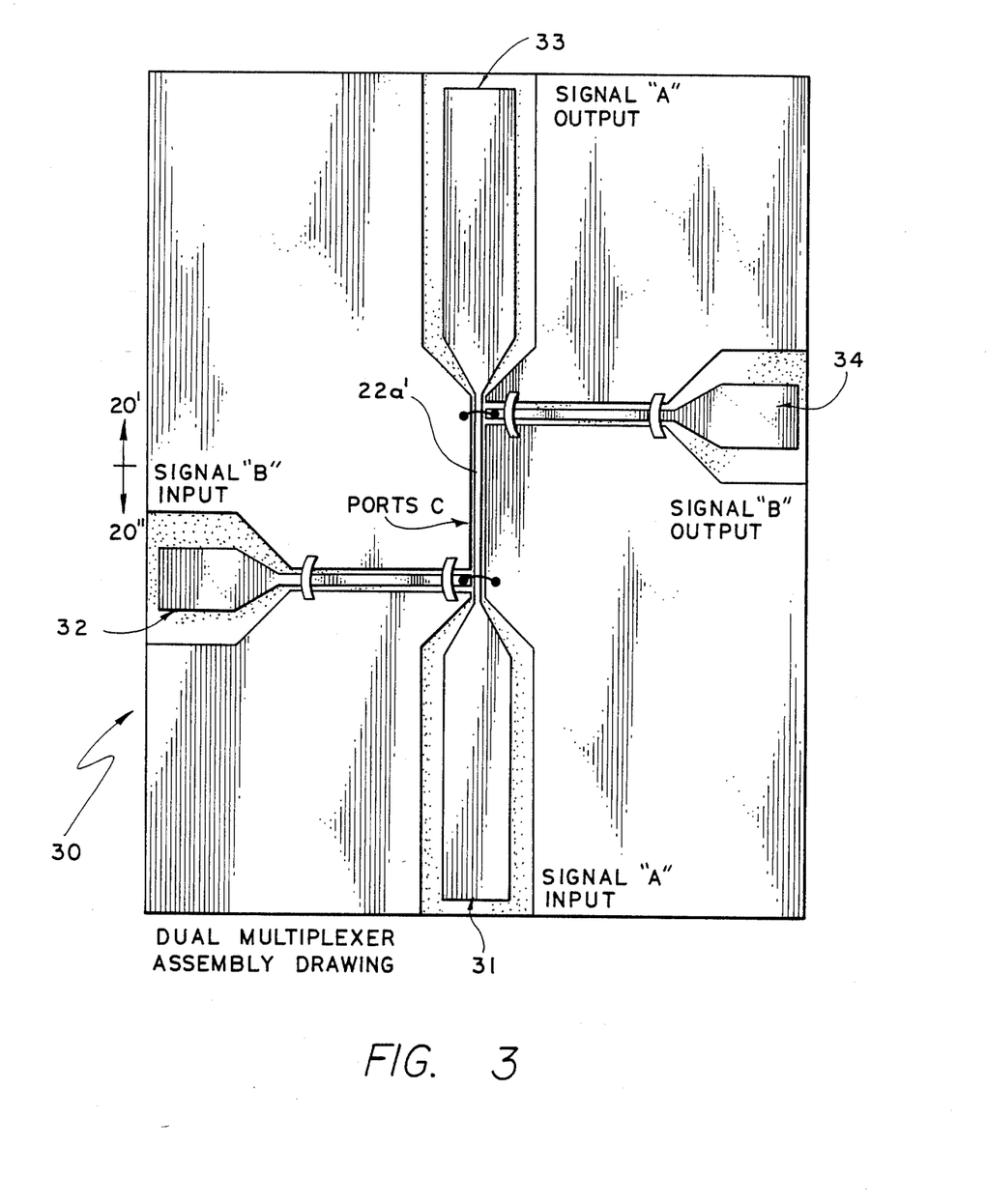
FIG. 3 is a plan view of a dual multiplexer assembly incorporating a pair of baluns of the type illustrated in FIG. 1.

The multiplexer characteristics of the device 20 advantageously are utilized in the dual multiplexer assembly 30 of FIG. 3. There it can be seen that the device 30 consists of a pair of coplanar microwave multiplexer assemblies 20' and 20" each having the configuration of FIG. 1. Here, however, the port C of the device 20' is directed and unitarily integrated with the corresponding port C of the device 20″. Alternatively expressed, the common transmission portions 22a of the devices 20′ and 20″ are united and constitute a single common transmission line 22a′. Of course, this common line 22a′ is of arbitrary length, and may be quite long.

In a typical application of the dual multiplexer assembly 30, separate input signals "A" and "B" are respectively provided to the input terminals 31 and 32, corresponding respectively to ports A and B of the device 20 of FIG. 1. The two signals then become multiplexed onto the common line 22a′ in different modes. Demultiplexing then takes place in the device 20′, providing separate output signals "A" and "B" on the respective output terminals 33 and 34 (which correspond respectively to ports A and B of the device 20). Multiplex signal transmission, and demultiplexing, thus is achieved. The device 30 of FIG. 3 is bidirectional. In other words, the "B" signal can be entered at either of the terminals 32 or 34 and recovered at the other. Similarly, the signal "A" can be injected at either of the terminals 31 and 33, and recovered at the other. The signals "A" and "B" can be transmitted "in opposite directions" along the common line 22a′, without interference.

Figure 4:
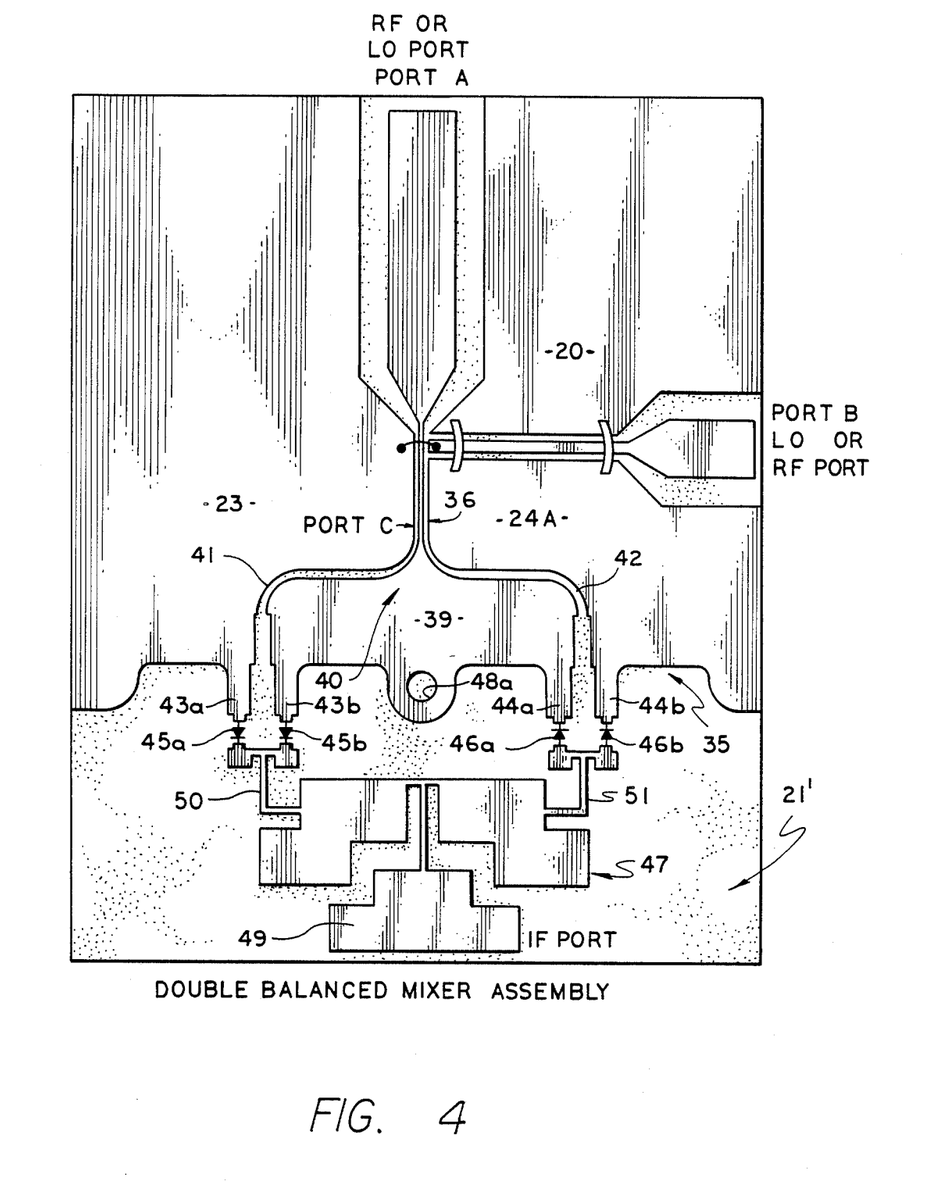
FIG. 4 is a double balanced mixer assembly utilizing the balun of FIG. 1.
Figure 4A:
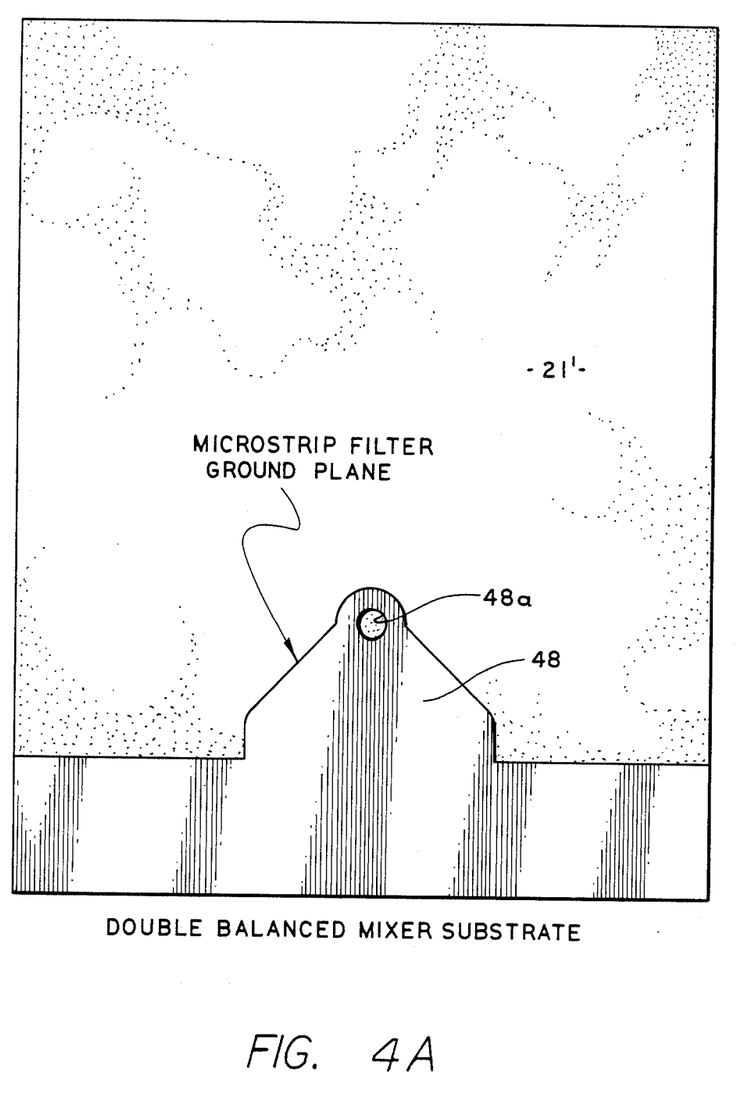
FIG. 4A is a plan view of the back side conductor pattern therefor.
Figure 5:
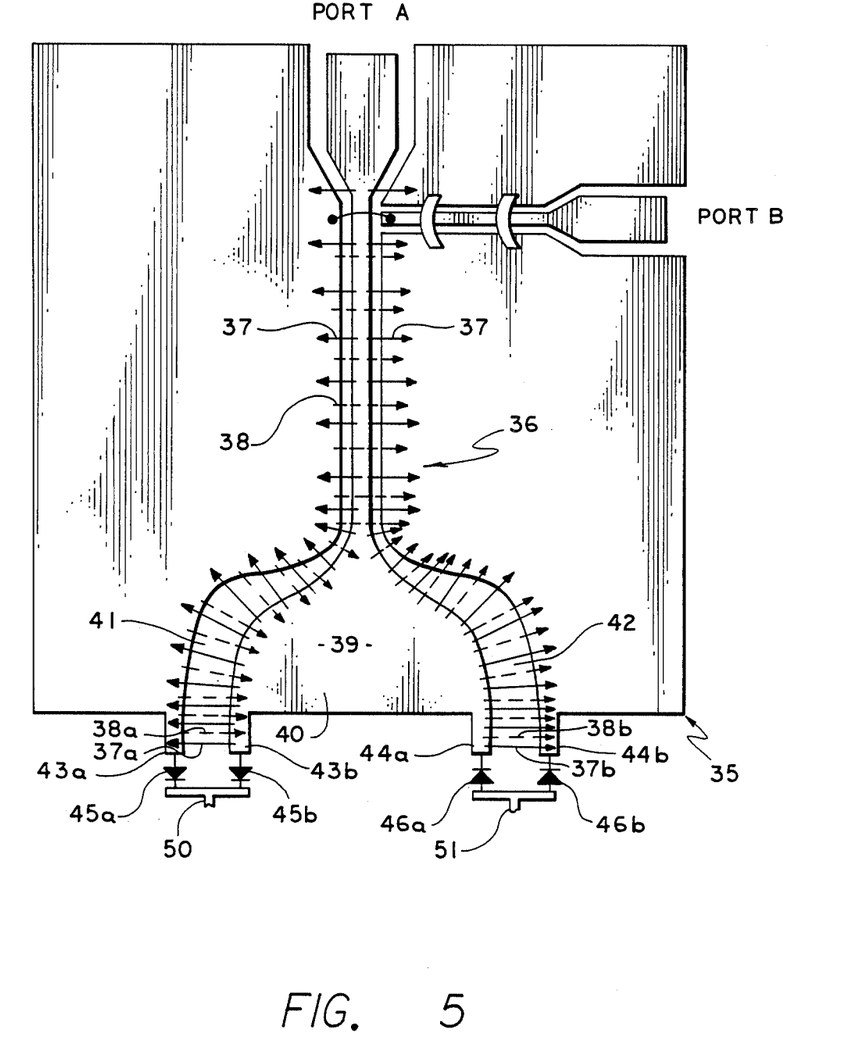
FIG. 5 is a diagrammatic view of the double balanced mixer assembly of FIG. 4, illustrating the electrical field distribution therein.

Another application of the inventive coplanar microwave balun is illustrated in FIGS. 4, 4A and 5. Here the balun is incorporated in a double balanced mixer assembly 35. In FIG. 4, elements corresponding to those in the device 20 in FIG. 1 are correspondingly numbered.

In the mixer assembly 35 of FIGS. 4 and 5, the RF input is applied to one of the ports A or B and the local oscillator (LO) input is applied to the other. The balun 20 portion of the mixer 35 operates in the manner described in connection with FIG. 1 to inject both the RF and LO signals onto the common line (designated 36 in FIGS. 4 and 5 but corresponding to the common line 22a in FIG. 1) in respectively different modes. Thus, as illustrated in FIG. 5, if the RF signal is injected at port A it will propagate along the common line 36 in an unbalanced mode, as illustrated by the solid arrows 37 in FIG. 5. A local oscillator (LO) signal injected at port B in the unbalanced mode will be launched by the device 20 onto the common line 36 in a balanced mode, as indicated by the broken arrows 38 which represent the electric field component of this signal.

In the mixer assembly 35, the port C of the balun 20 communicates to a splitter 39 formed in part by broadening the end of the transmission line strip 25 to form a ground plane region 40. This region 40 defines one side of a pair of slot lines 41, 42 which respectively are the continuations of the portions of the coplanar waveguide common line 36 on either side of the strip 25. The other sides of the slot lines 41 and 42 are defined by the ground plane regions 23 and 24A of the device 20.

As illustrated in FIG. 5, with this arrangement, the signals propagating down the common line 36 are separated by the splitter 39 into two pairs of signals propagated respectively along the separate slot lines 41 and 42. In the illustration of FIG. 5, along the slot line 41, the direction of the electric field 37a of the RF signal is opposite from the electric field of the LO signal. On the other hand, in the slot line 42, the electric field directions of the RF and LO signals 38b are illustrated in the same direction. This situation arises as a consequence of the propagation of the RF and LO signals along the common line 36 in different (respectively unbalanced and balanced) modes.

The ground plane regions of the slot lines 41 and 42 terminate in respective pairs of coplanar strips 43a, 43b and 44a, 44b to which are connected oppositely poled pairs of diodes 45a, 45b and 46a and 46b. These diode pairs in turn are connected to a microstrip structure 47 which has a ground plane 48 (FIG. 4A) formed on the underside of the assembly dielectric substrate 21′ and which is electrically connected via a plated through hole 48a to the ground plane 40 of the splitter 39.

This structure acts as a pair of single-balanced mixers, the first including the coplanar strips 43a, 43b and diodes 45a, 45b and the second including the strips 44a, 44b and the diodes 46a, 46b. The outputs of these mixers are combined in the microstrip structure 47.

From an rf standpoint, in each of the single balanced mixers a potential is developed across the two coplanar strips. In other words, an rf potential is developed between the coplanar strips 43a and 43b in the left hand single balanced mixer of FIG. 4, and this potential is rectified by the diodes 45a and 45b. This results in mixing of the RF and LO signals 37a, 38a which have the out-of-phase E-fields illustrated along the slot line 41 of FIG. 5. Similarly, in the right hand single balanced mixer of FIG. 4, a potential is developed across the coplanar strips 44a, 44b which is rectified by the diodes 46a, 46b to mix the RF and LO signal components that have the in-phase E-fields 37b, 38b illustrated in FIG. 5. The diodes 45a, 45b are poled oppositely from the diodes 46a, 46b. This results in an appropriate combining action in the microstrip structure 47 in which the desired mixing products are in phase and are combined to produce the desired IF output signal at the assembly IF port 49.

In the embodiment of FIGS. 4 and 4A, the microstrip structure 47 acts as a low pass filter which allows only the IF frequencies from the mixer asssembly to be delivered via the port 49. In the typical embodiment, the RF signal may be in the range of from 6 GHz to 18 GHz and the local oscillator (LO) signal may be in the range from 6 GHz to 18 GHz. In this instance the IF signal may be in the range of DC to 10 GHz, so that the low pass filter assembly 47 advantageously may be configured to have a cutoff frequency of about 10 GHz. The structure 47 also may be considered to act as an in-phase combiner which combines the in-phase components of the two single balanced mixers, and which cancels the even-ordered products which are out of phase as received by the structure 47 via the lines 50, 51 from the diode pairs 45a, 45b and 46a, 46b respectively.

Figure 6:
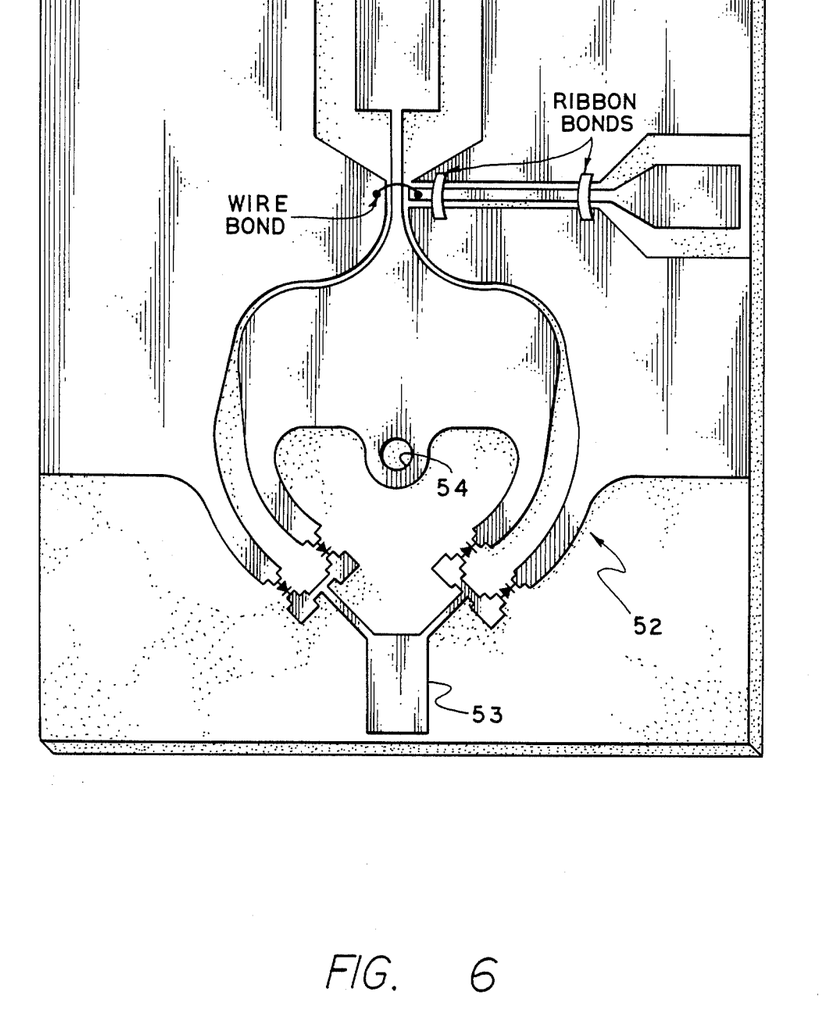
FIG. 6 is a plan view of another double balanced mixer assembly similar to that of FIG. 4.
Figure 6A:
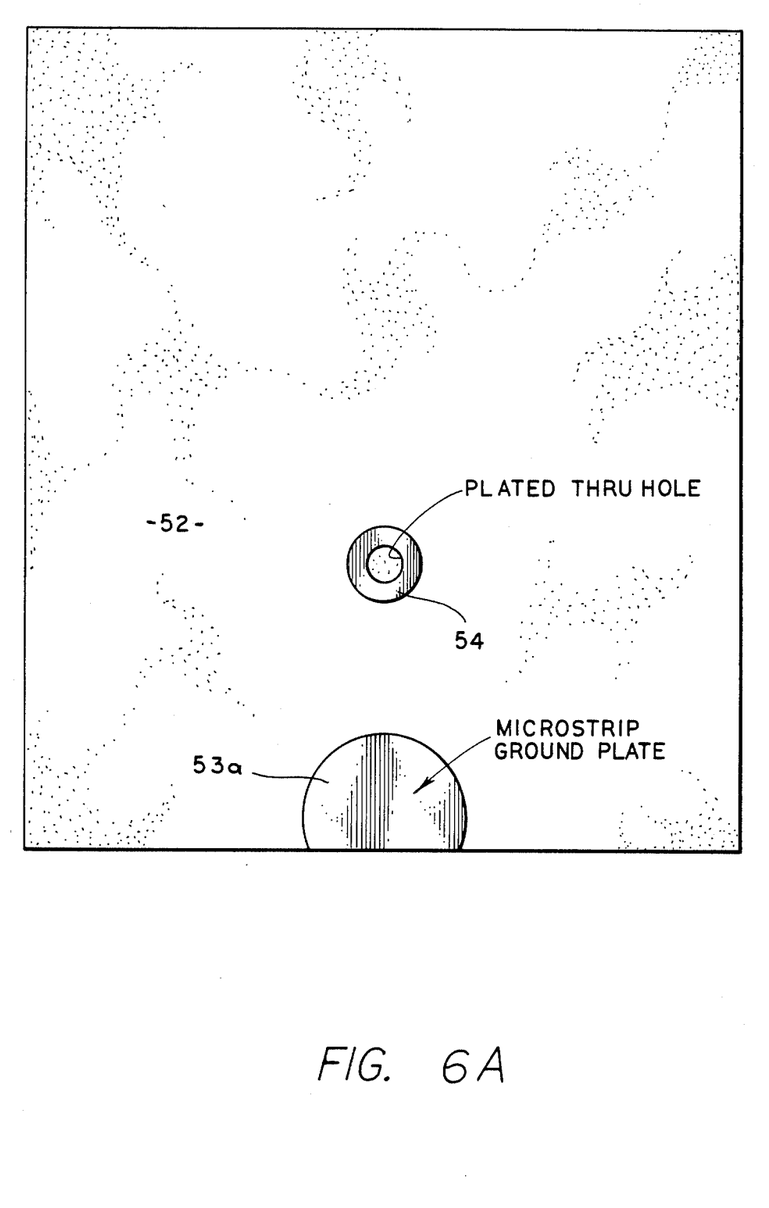
FIG. 6A shows the back side thereof.

In the double balanced mixer assembly 35 of FIG. 4 the microstrip structure 47 acts as a low pass filter and hence defines the output frequency range. The present invention is not so limited, however, and FIGS. 6 and 6A show an alternative embodiment of a double balanced mixer assembly 52 in which there is no filter structure associated with the output port 53. While operating in other respects like the mixer assembly 35 of FIG. 4, the mixer assembly 52 of FIG. 6 will either up-convert or down-convert, and may actually do both simultaneously.

The ground plane configuration for the mixer 52 is shown in FIG. 6A and includes a microstrip ground plane 53a and plated through hole 54 that communicates to the splitter region of the device 52 shown in FIG. 6.

Figure 7:
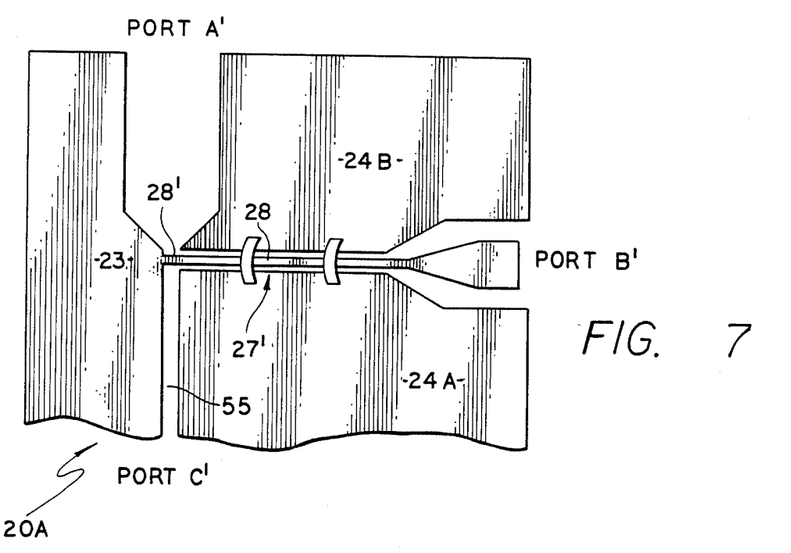
FIG. 7 is a top plan view of a balun in accordance with the present invention and utilizing a coplanar waveguide and a slot line.

FIG. 7 shows an alternative version 20A of the inventive balun in which a signal delivered via a coplanar waveguide 27′ is launched into a slot line 55. In this arrangement, the wire bond bridge 29 of the balun of FIG. 1 is replaced by an integral portion 28' of the transmission line strip 28 in the coplanar waveguide 27'. This portion 28' is attached directly to the ground plane 23.

As in the balun 20 of FIG. 1, a signal delivered onto the coplanar waveguide 27' via the port B' in FIG. 7 will be launched via the segment 28' into the slot line 55 in a balanced mode. In this regard the balun 20A of FIG. 7 functions in the same manner as the balun of FIG. 1.

Figure 8:
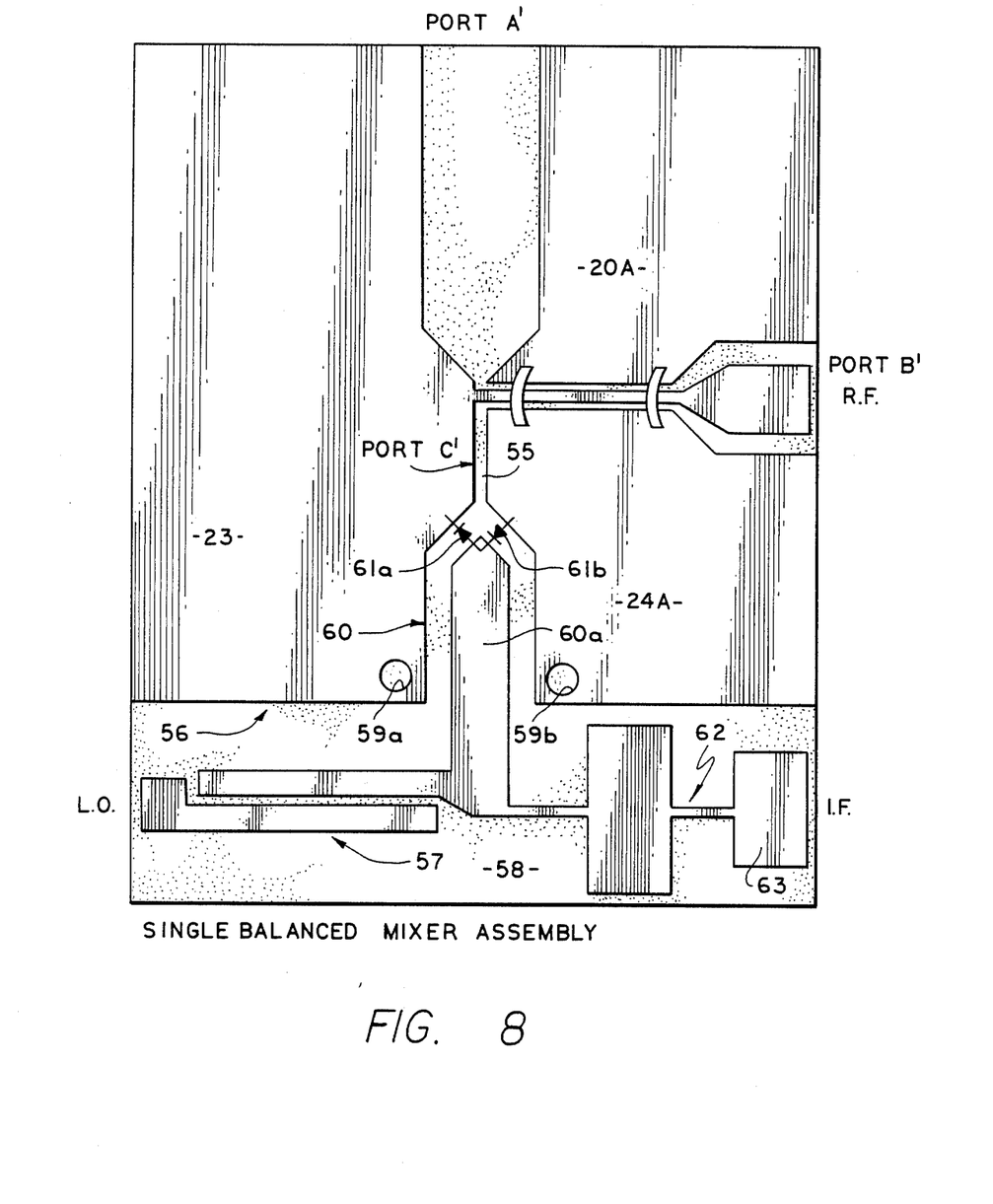
FIG. 8 is a top plan view of a single balanced mixer assembly utilizing the balun of FIG. 7.
Figure 8A:
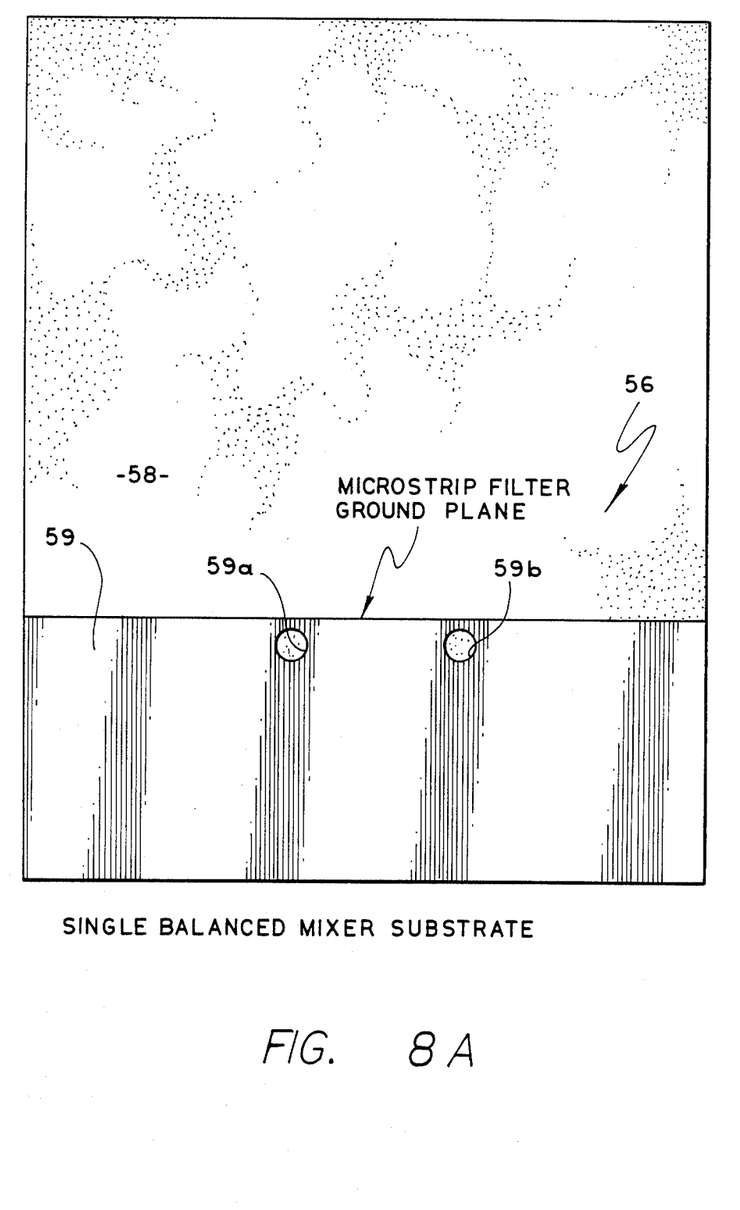
FIG. 8A shows the back side conductor pattern of such mixer.

The coplanar waveguide to slot line balun configuration 20A of FIG. 7 advantageously is employed in the single balanced mixer assembly 56 of FIG. 8 and 8A. In that device, the RF signal is introduced into the port B' in an unbalanced mode. By operation of the balun 20A, this RF signal is launched into the slot line 55 in a balanced mode, and appears in this mode at the port C'.

In the mixer 56, the local oscillator (LO) signal is introduced through a filter 57 via a microstrip transmission line in which the E-fields extend down through the dielectric substrate to the ground plane 59 shown in FIG. 8A. The LO signal then is communicated onto a coplanar waveguide 60 atop the substrate 58. In this regard, the ground plane 59 is electrically connected to the ground planes 23 and 24A of the coplanar waveguide 60 via plated through holes 59a and 59b.

At port C', the slot line 55 widens out and branches to join the coplanar waveguide 60. As a result of this widenening, the port C' looks like an open circuit to the RF signal propagating down the slot line 55. A pair of diodes 61a, 61b are situated at this flared location adjacent port C and are attached respectively from the ground plane regions 23 and 24A to the transmission line strip 60a of the coplanar waveguide 60.

With this arrangement, the diodes 61a, 61b are biased on and off by the LO signal communicated via the coplanar waveguide 60 and are also switched on and off by the RF signal propagating down the slot line 55. Because the diodes 61a and 61b are poled oppositely with respect to the strip 60a, the LO signal effectively alternatively turns on and off first the diode 61a and then the diode 61b. At the same time, the RF signal, propagating in the unbalanced mode, is available at the diodes 61a and 61b. This results in the mixing operation.

The resultant IF signal is communicated out of the assembly 56 via the same coplanar waveguide 60, a microwave filter structure 62 and an IF port 63.

Figure 9:
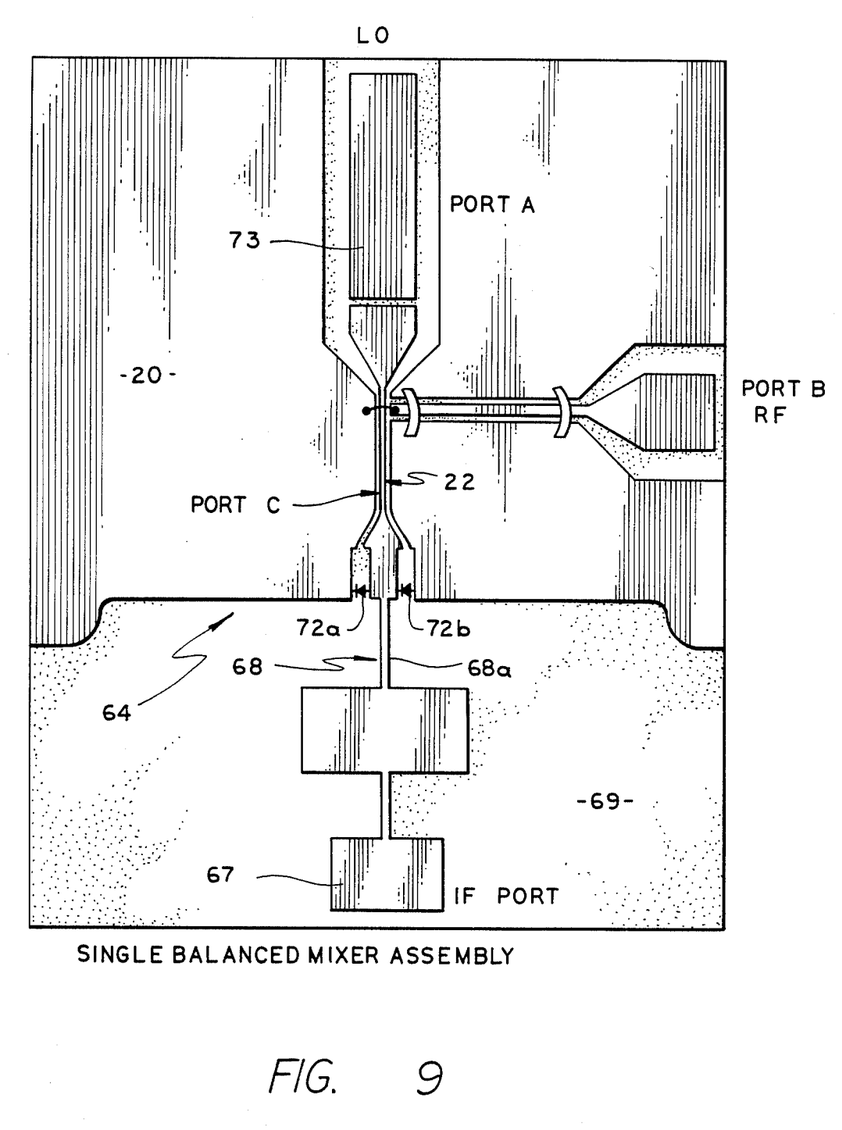
FIG. 9 is a plan view of another single balanced mixer assembly employing the balun of FIG. 1.
Figure 9A:
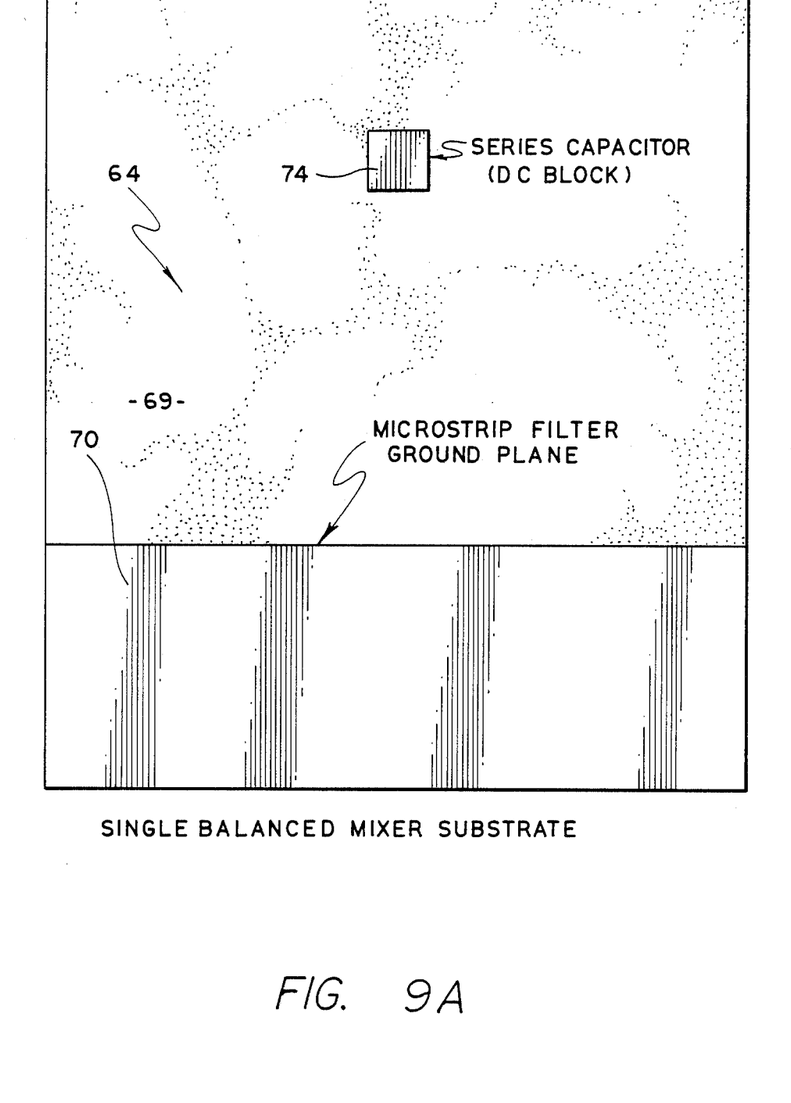
FIG. 9A shows the back side conductor pattern therefor.

FIGS. 9 and 9A illustrate a single balanced mixer assembly 64 utilizing the balun 20 of FIG. 1. In this embodiment, the RF signal is delivered to port B and is launched onto the common coplanar waveguide 22 in a balanced mode, as described in connection with FIG. 1. The LO signal is delivered to port A and is transmitted to waveguide 22 in an unbalanced mode, as described in connection with FIG. 1.

At port C, the coplanar waveguide branches out in order to accommodate the diode size. The IF signal is extracted at a port 67 via a microstrip transmission line 68 consisting of a strip 68a atop the dielectric substrate 69 and a ground plane 70 (FIG. 9A) beneath the substrate. A pair of diodes 72a, 72b are connected across the respective ends of these slot lines.

With this arrangement, the diodes 72a, 72b are biased on and off by the LO signal, as described in FIG. 8. The same diodes 72a, 72b are biased on and off by the RF signal propagating down the common line 22. Mixing occurs, and a resultant IF signal is produced which is extracted via the microstrip transmission line 68 and the common IF port 67.

Note that the end of the common line 22 where the diodes 72a, 72b are located, appears as an open circuit to the RF signal propagating in the balanced mode. This is because this end opens into the very wide area atop the substrate 69 on either side of the microstrip line 68a. In the embodiment of FIG. 9, the port A is used as the LO port, and the IF signal is terminated by a series blocking capacitor formed by an isolated region 73 atop the substrate 69 and a region 74 (FIG. 9A) beneath it.

Figure 10:
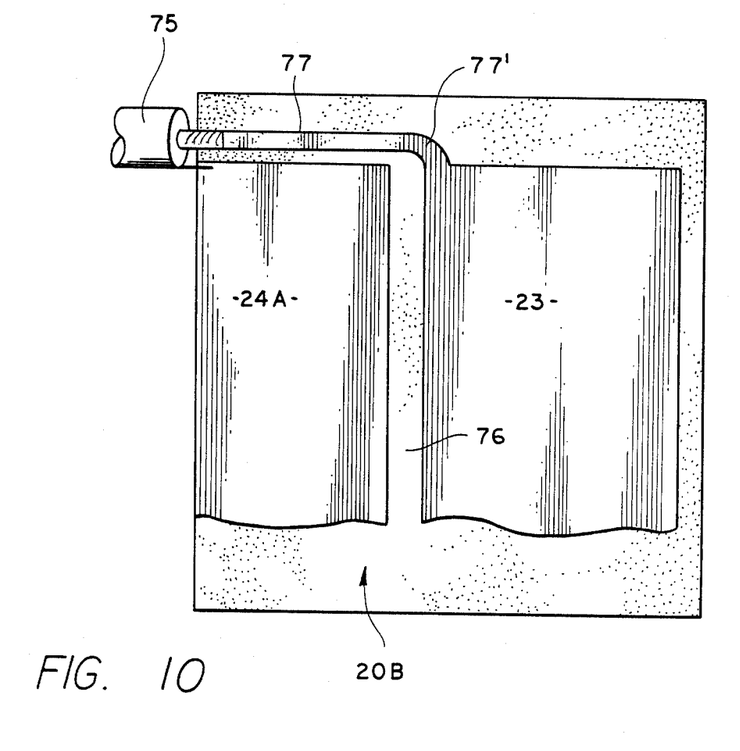
FIG. 10 is a top plan view of another balun embodiment in accordance with the present invention.

FIG. 10 illustrates an alternative embodiment of the present invention wherein the balun 20B launches an unbalanced signal, which may be delivered via a coaxial cable 75, onto a slot line 76 defined by the ground planes 23 and 24A.

In this embodiment, the outer shield of the coaxial cable 75 communicates to the ground plane 24a and the center conductor of the coaxial cable 75 communicates to the transmission line formed by the transmission line strip 77 and the ground plane 24A. The end 77' of the strip 77 extends across the end of the slot line 76 and becomes unitary with the ground plane 23. Thus the region 77' acts in the same manne as the wire bond bridge 29 of the embodiment of FIG. 1. That is, a signal from the coaxial cable 75 communicated in the unbalanced mode via the transmission line strip 77 is launched by the bridge region 77' into the slot line 76 in the balanced mode.

Thus the balun 20B of FIG. 10 operates in the same manner as the balun 20 of FIG. 1 or the balun 20A of FIG. 7. Each is a coplanar structure in which a signal propagating in an unbalanced mode is launched onto another coplanar transmission line in the balanced mode. The mixers of FIGS. 4, 6, 8 and 9 also may be used as modulators.

I claim:

1. A coplanar waveguide multiplexer comprising, on a dielectric substrate;

a first coplanar waveguide having first and second ground plane regions respectively on opposite sides of a first transmission line strip, said first coplanar waveguide having a narrow portion, a wide portion, and a flared portion therebetween, the free end of the wide portion of said first coplanar waveguide defining a port A of said multiplexer, the free end of the narrow portion of said first coplanar waveguide defining a port C of said multiplexer, and a second coplanar waveguide, said first ground plane region itself being separated into a pair of regions which constitute the ground planes of said second coplanar waveguide, the transmission line strip of said second coplanar waveguide extending along the center of the separation between said pair of regions, one end of the transmission line strip of said second coplanar waveguide ending adjacent to said first coplanar waveguide, there being a wire bond bridging from said one end across the transmission line strip of said first coplanar waveguide to said second ground plane region, said pair of regions being electrically connected by bonds which bridge across the transmission line strip of said second coplanar waveguide, the free end of said second coplanar waveguide defining a port B for said multiplexer, said multiplexer exhibiting electrical isolation between said port A and said port B, a signal injected via port A in an unbalanced mode being delivered via said first coplanar waveguide to said port C in an unbalanced mode, and not being delivered to said port B, a signal injected via said port B in an unbalanced mode being launched from said second coplanar waveguide onto said first coplanar waveguide and delivered to said port C in a balanced mode, but not being delivered to port A, whereby said signals injected respectively via said ports A and B are multiplexed together onto the narrow portion of said first coplanar waveguide in respectively different modes.

2. A coplanar waveguide multiplexer according to claim 1 wherein said second coplanar waveguide ends at the narrow portion of said first coplanar wave guide adjacent said flared portion.

3. A dual multiplexer comprising a pair of coplanar waveguide multiplexers each according to claim 1, and assembled as a unitary structure on a common dielectric substrate, the port C of one such multiplexer being connected to and unitary with the port C of the other such multiplexer.

4. A double balanced mixer assembly comprising a coplanar waveguide multiplexer according to claim 1 together with, on the same dielectric substrate;

a coplanar splitter formed by flaring the transmission line strip of said first coplanar waveguide at said port C into a broad zone and correspondingly flaring the first and second ground plane regions of said first coplanar waveguide at said port C so that a pair of microwave slot lines are formed respectively between said first ground plane region and said widened zone and between said widened zone and said second ground plane region, and first and second pairs of coplanar strips extending respectively from the ends of said pair of slot lines, first and second pairs of diodes connected to said respective pairs of coplanar strips, and means for connecting the other ends of said diodes to a common IF port, and means for communicating an RF signal to one of said port A or port B and for communicating a local oscillator signal to the other of said port A and port B, the resultant mixed signal being delivered via said IF port.

5. A mixer according to claim 4 wherein said means for connecting comprises a microstrip low pass filter.

6. A single balanced mixer assembly comprising a coplanar waveguide multiplexer according to claim 1 together with;

first and second diodes respectively at port C, a microstrip transmission line formed on said dielectric substrate and communicating between an IF port and the flared portion of said transmission line strip at said port C, and means for delivering an RF signal to one of said port B and said port A, and for delivering a local oscillator signal to the other of said port B and port A, and means for recovering the resultant mixed signal from said IF port.

* * * * *